(12) United States Patent
Chuang et al.

(10) Patent No.: US 8,563,389 B2
(45) Date of Patent: Oct. 22, 2013

(54) INTEGRATED CIRCUIT HAVING SILICON RESISTOR AND METHOD OF FORMING THE SAME

(75) Inventors: Harry-Hak-Lay Chuang, Singapore (SG); Ming Zhu, Singapore (SG); Lee-Wee Teo, Singapore (SG); Bao-Ru Young, Zhebei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 55 days.

(21) Appl. No.: 13/110,693

(22) Filed: May 18, 2011

(65) Prior Publication Data

US 2012/0292739 A1    Nov. 22, 2012

(51) Int. Cl.
    *H01L 21/20*    (2006.01)
(52) U.S. Cl.
    USPC ............... 438/382; 438/638; 257/536
(58) Field of Classification Search
    USPC .......... 438/638, 637, 639, 640; 257/380, 529, 257/538, 379, E29.325, E27.016, E21.003, 257/E21.602
    See application file for complete search history.

(56) References Cited

U.S. PATENT DOCUMENTS

| | | | |
|---|---|---|---|
| 6,140,207 A * | 10/2000 | Lee ............................. | 438/427 |
| 6,734,081 B1 * | 5/2004 | Puchner et al. ............... | 438/432 |
| 8,133,783 B2 * | 3/2012 | Gogoi .......................... | 438/267 |
| 8,138,037 B2 * | 3/2012 | Chudzik et al. .............. | 438/199 |
| 8,211,775 B1 * | 7/2012 | Ma et al. ..................... | 438/287 |
| 2009/0090977 A1* | 4/2009 | Freeman et al. ............. | 257/379 |
| 2009/0302384 A1* | 12/2009 | Izumi .......................... | 257/339 |
| 2010/0140714 A1* | 6/2010 | Ren et al. .................... | 257/368 |
| 2010/0176458 A1* | 7/2010 | Nakajima ..................... | 257/379 |
| 2010/0328022 A1* | 12/2010 | Fan et al. ..................... | 338/309 |
| 2011/0037128 A1* | 2/2011 | Chakravarti et al. ......... | 257/379 |
| 2011/0057267 A1 | 3/2011 | Chuang et al. | |
| 2011/0117710 A1* | 5/2011 | Lin et al. ..................... | 438/238 |
| 2011/0266637 A1* | 11/2011 | Lee et al. ..................... | 257/410 |

* cited by examiner

*Primary Examiner* — Phuc Dang
(74) *Attorney, Agent, or Firm* — Lowe, Hauptman & Ham, LLP

(57) ABSTRACT

An embodiment of the disclosure includes a method of forming an integrated circuit. A substrate having an active region and a passive region is provided. A plurality of trenches is formed in the passive region. A root mean square of a length and a width of each trench is less than 5 μm. An isolation material is deposited over the substrate to fill the plurality of trenches. The isolation material is planarized to form a plurality of isolation structures. A plurality of silicon gate stacks and at least one silicon resistor stack are formed on the substrate in the active region and on the plurality of isolation structures respectively.

20 Claims, 15 Drawing Sheets

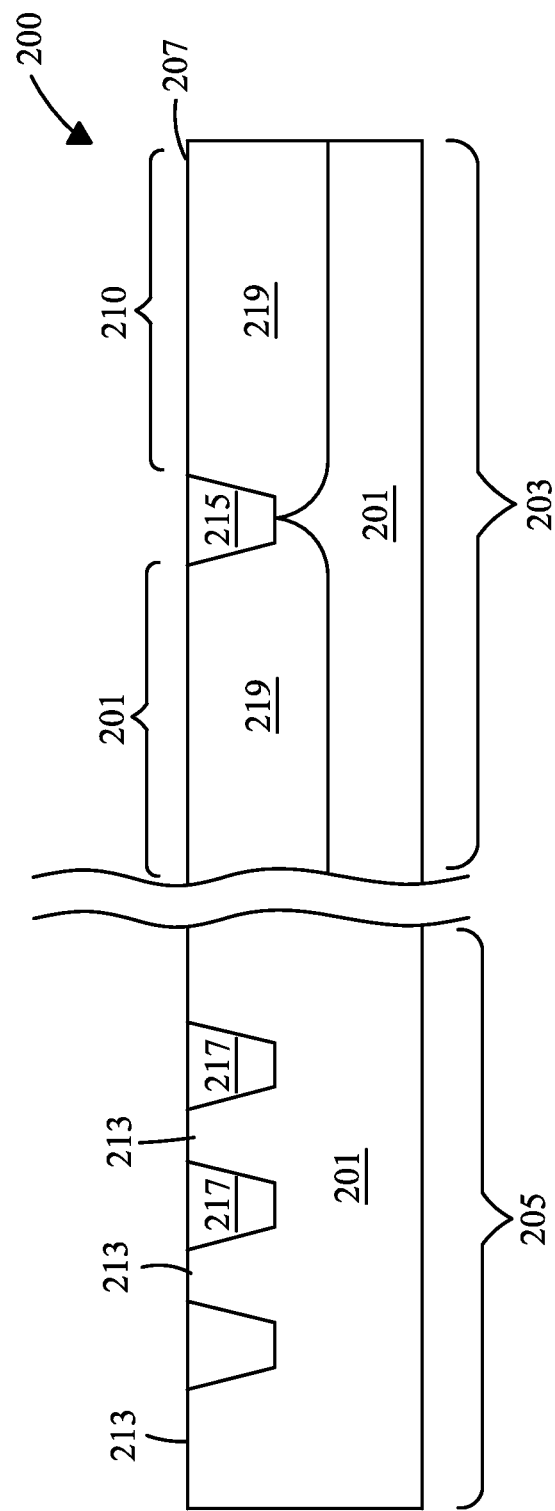

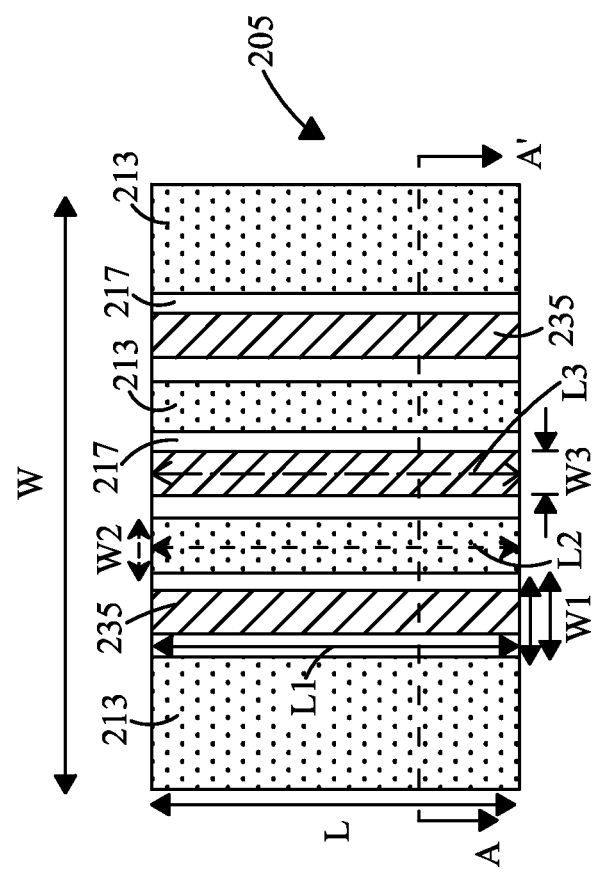

US 8,563,389 B2

INTEGRATED CIRCUIT HAVING SILICON RESISTOR AND METHOD OF FORMING THE SAME

TECHNICAL FIELD

The disclosure relates generally to an integrated circuit and, more particularly, to a structure and method for forming an integrated circuit having a silicon resistor.

BACKGROUND

Silicon resistors have been frequently used in integrated circuit (IC) design. The silicon resistors can provide impedance matching for various applications, such as analog, radio frequency (RF) and mixed-mode circuits. Likewise, due to shrinking technology nodes, high dielectric constant (high K) dielectric material and metal are often considered to form a gate stack for a semiconductor device such as a metal-oxide-semiconductor field-effect transistor (MOSFET). However, various integration issues exist when combining silicon resistors and metal-gate MOSFETs onto a single IC chip. One solution is to utilize a dummy gate when forming a silicon resistor. Gate replacement processes, such as an etching process, a metal-gate filling process and a planarizing process, can be implemented to replace the dummy gate. However, the formed silicon resistor may be damaged or metal residues may be formed during the gate replacement processes. Therefore, electrical shorting and device failure could occur.

BRIEF DESCRIPTION OF THE DRAWINGS

Aspects of the present disclosure are best understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 2A, 3, 4A, 5, 6, 7B, 7C, 8B, 8C and 9 are cross-sectional views of a portion of an integrated circuit having a silicon resistor at various stages of manufacture according to one or more embodiments of this disclosure.

FIGS. 2B, 4B, 7A and 8A are top views of a passive region of a portion of an integrated circuit having the silicon resistor at various stages of manufacture according to one or more embodiments of this disclosure.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

Figure 1:
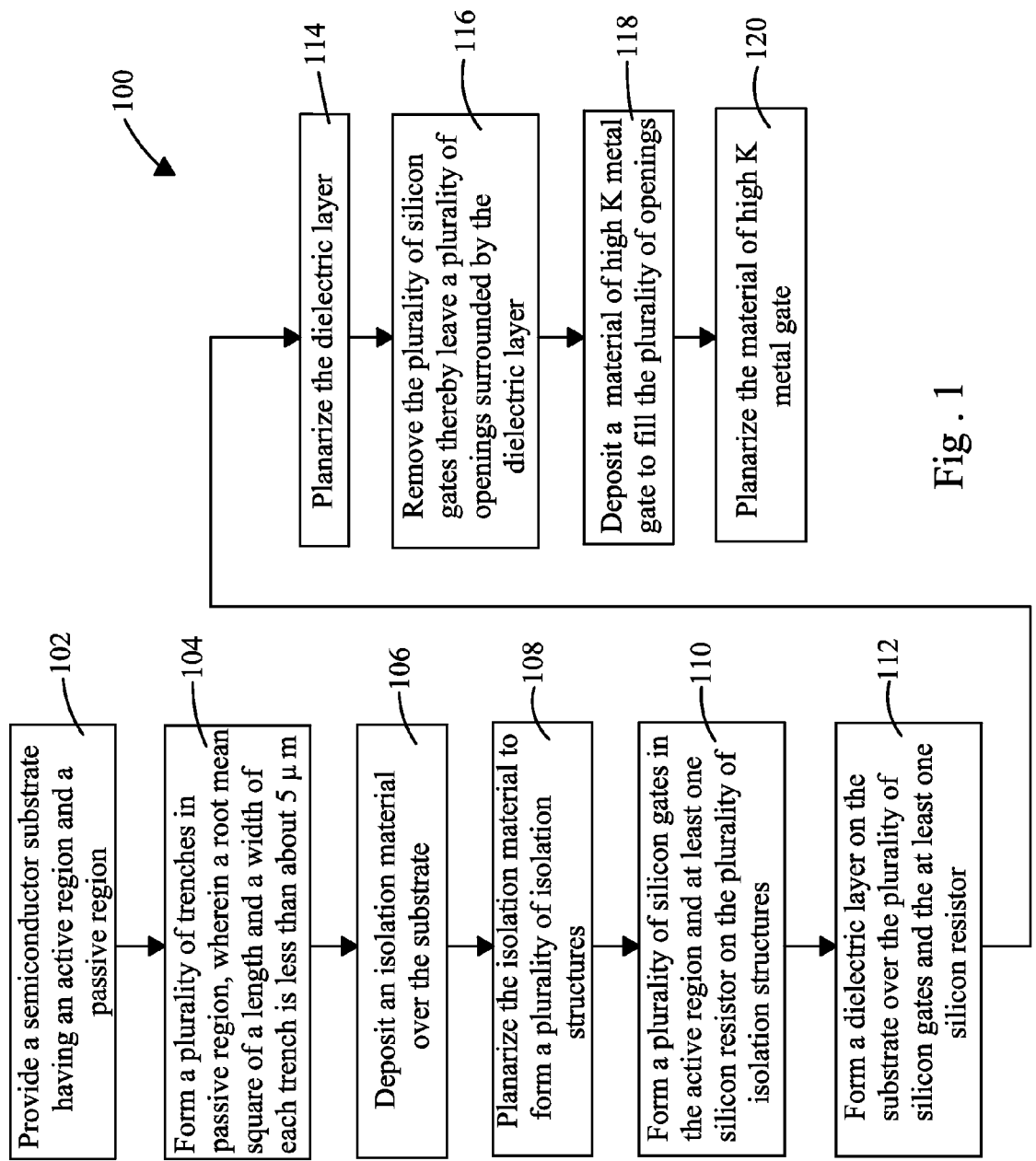
FIG. 1 is a flowchart of a method of forming an integrated circuit having a silicon resistor according to one or more embodiments of this disclosure.

Illustrated in FIG. 1 is a flowchart of a method 100 of forming an integrated circuit having a silicon resistor according to one or more embodiments of this disclosure. FIGS. 2A, 3, 4A, 5, 6, 7B, 7C, 8B, 8C and 9 are cross-sectional views of a structure 200 having a silicon resistor at various stages of manufacture according to one or more embodiments of this disclosure. FIGS. 2B, 4B, 7A and 8A are top views of a passive region of the structure 200 at various stages of manufacture according to one or more embodiments of this disclosure. It should be noted that additional processes may be provided before, during, or after the method 100 of FIG. 1. Various figures have been simplified for a better understanding of the inventive concepts of the present disclosure.

Referring now to FIG. 1, at operation 102, a semiconductor substrate is provided. A plurality of chip regions are marked on the semiconductor substrate by scribe lines between the chip regions. The semiconductor substrate of each chip region has an active region and a passive region. The active region is adjacent to the passive region. A variety of cleaning, layering, patterning, etching and doping steps may be performed with respect to the semiconductor substrate to form the integrated circuit. The term "semiconductor substrate" herein generally refers to the semiconductor bulk substrate on which various layers may be formed. In some embodiments, the semiconductor bulk substrate includes a silicon or compound semiconductor, such as GaAs, InP, Si/Ge, or SiC. Examples of such layers include dielectric layers, doped layers, polysilicon layers or conductive layers.

Next, method 100 continues with operation 104 in which the semiconductor substrate is patterned to form a plurality of trenches in the passive region. A root mean square of a length and a width of each trench is less than about 5 µm.

Figure 2A:
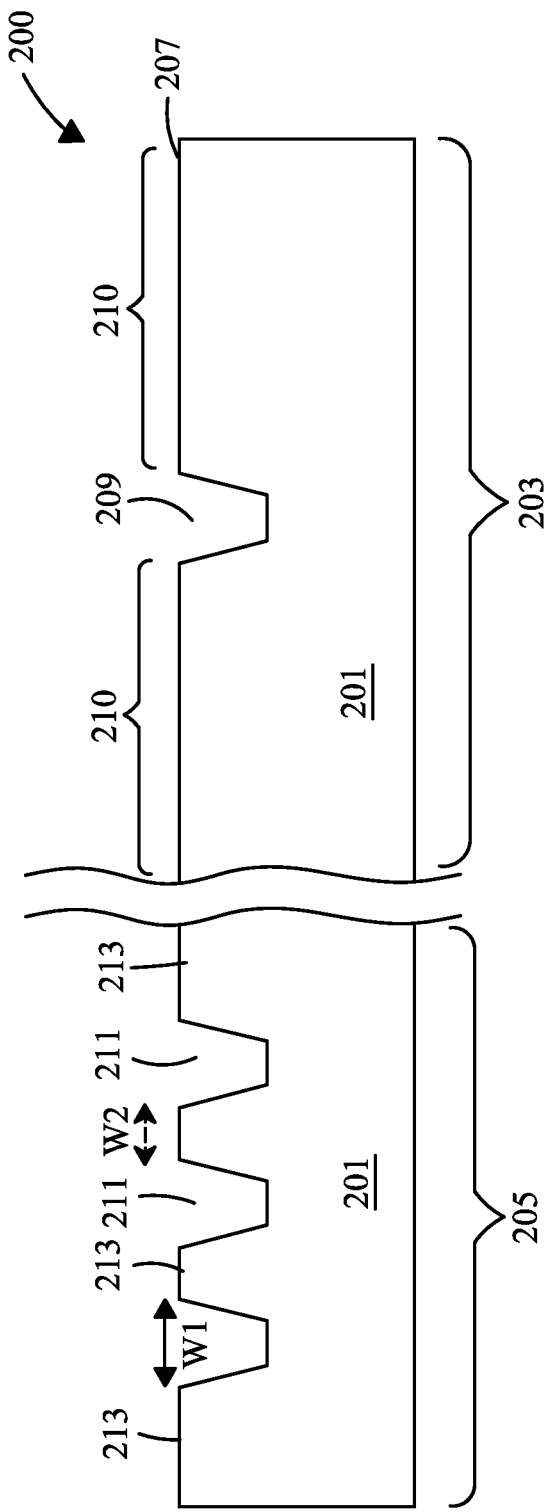

Referring to FIG. 2A, which is an enlarged cross-sectional view of a portion of a substrate 201 of a structure 200 after performing operation 104. The substrate 201 has a top surface 207, an active region 203 and a passive region 205. The active region 203 is adjacent to the passive region 205. The active region 203 may be used to form components of active devices (such as transistors or diodes). The passive region 205 may used to form components of passive devices (such as resistors or fuses). The structure 200 also includes various trenches 209/211 formed, extending through the top surface 207 into a predetermined depth of substrate 201. The trenches 209 are formed in the active region 203. The trench 209 separates active areas 210 for forming active devices on the top surface 207 of the substrate 201. Trenches 211 are formed in the passive region 205. The trenches 211 may be used to form resistors on the top in the following processes.

Figure 2B:
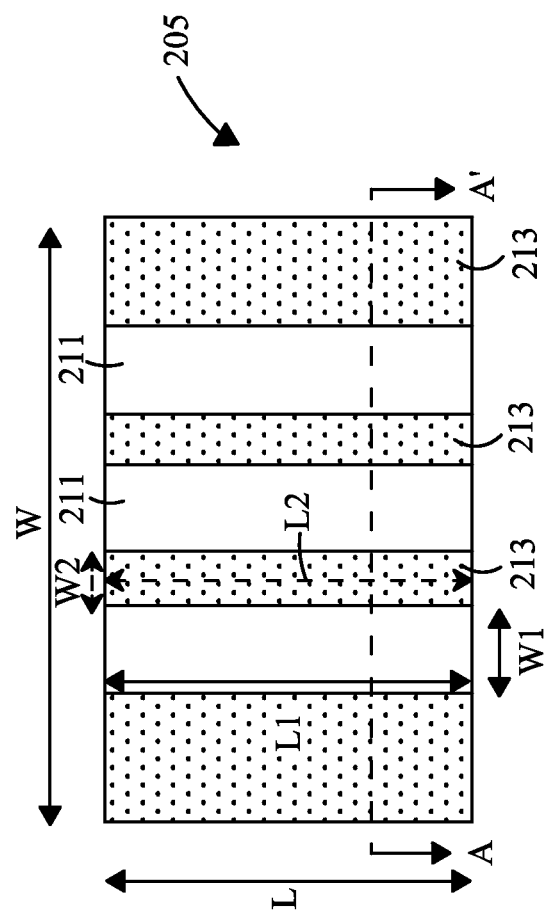

FIG. 2B is a top view of the passive region 205 illustrated in FIG. 2A. The passive region 205 in FIG. 2A is the cross-sectional view obtained from the vertical plane crossing line A-A' in FIG. 2B. Referring to FIG. 2B, the passive region 205 has a rectangle area defined by a length L and a width W. In one embodiment, the length L is longer than about 1.2 µm. The width W is wider than about 1.2 µm. The passive region 205 comprises a plurality of trenches 211 and a plurality of dummy structures 213 filled in the rectangle area not occupied by the trenches 211. The plurality of dummy structures 213 is a portion of the substrate 201. In one embodiment, for every two consecutive trenches 211, a dummy structure 213 is sandwiched between the two trenches 211 in the passive region 205. Each trench 211 is defined by a length $L_1$ and a width $W_1$. In one example, the length $L_1$ is in a range of about 1.2 µm to about 10 µm. The width $W_1$ is in a range of about 1.2 µm to about 10 µm. A root mean square of the length $L_1$ and the width $W_1$ of each trench 211 is less than about 5 µm.

In another embodiment, the passive region 205 comprises only one trench 211 and no dummy structure 213. The only one trench 211 fills all the rectangle area of the passive region 205. A root mean square of the length $L_1$ and the width $W_1$ of the only one trench 211 is less than about 5 µm. For example, the length $L_1$ is about 3 µm and the width $W_1$ is about 4 µm.

In one example, a portion of the plurality of trenches 211 has different sizes in the passive region 205. Other portion of the plurality of trenches 211 has the same size in the passive region 205. In another example, all of the trenches 211 have different sizes in the passive region 205. In yet another example, all of the trenches 211 have the same size in the passive region 205.

Each dummy structure 213 is defined by a length $L_2$ and a width $W_2$. In one embodiment, the length $L_2$ is in a range of about 0.4 μm to about 10 μm. The width $W_2$ is in a range of about 0.07 μm to about 10 μm. A ratio of the width $W_2$ of each dummy structure 213 to the width $W_1$ of each trench 211 is larger or equal to about 6%. Advantageously, use of the dummy structures 213 improves the uniformity of the polished surface of isolation structures 217 (FIG. 3) formed in the trenches 211 in the later planarization process of operation 108. The dummy structures 213 filled in the passive region 205 not occupied by the trenches 211 limit the sizes of the trenches 211 and therefore, compared with large size trenches, prevent or significantly reduce dishing effect.

In various embodiments, the trenches 209/211 may be formed by a dry etching process. In one example, a patterned masking layer (not shown) is formed over the substrate 201 to cover the un-removed areas and expose portions of the substrate 201 to enable the formation of the trenches 209/211. The masking layer may be a hardmask comprising silicon nitride, oxide, or oxynitride formed through a chemical vapor deposition (CVD) process. Once formed, the masking layer is patterned through suitable photolithographic and etching processes to expose those portions of the substrate 201 that will form the trenches 209/211. Then, the exposed substrate 201 is removed by dry etching to form the trenches 209/211.

Next, method 100 continues with operation 106 in which an isolation material is deposited over the substrate to fill the plurality of trenches.

Method 100 continues with operation 108 in which the isolation material deposited over the substrate is planarized to form a plurality of isolation structures in the trenches in the substrate. During the planarization process, the polish rate of the isolation material filled in the trenches 209 and the trenches 211 may be evenly distributed to the whole substrate 201, and thus the polished surface of the later formed isolation structures 217/215 and the substrate 201 have a smooth surface.

FIG. 3 is a cross-sectional view of the structure 200 after the performance of operation 106 and operation 108. An isolation material is deposited over the substrate 201 to fill the plurality of trenches 209/211. The isolation material may comprise silicon oxide, silicon nitride, silicon oxynitride, fluoride-doped silicate glass (FSG), other suitable insulating materials, and/or combinations thereof. The isolation material overfills the trenches 209/211 and is over the top surface 207 of the substrate 201. Then, a planarization process removes the excess isolation material outside the trenches 209/211 and the top surface 207 through a suitable process such as chemical mechanical polishing (CMP), an etch, or a combination thereof. The planarization process will expose the top surface 207 of active areas 210. A plurality of isolation structures 215/217 are formed in the trenches 209/211, respectively. The isolation structures 215/217 electrically isolate individual active/passive devices in the active region 203 and the passive region 205.

The isolation structures 217 formed in the trenches 211 are shown in FIG. 3. Each isolation structure 217 has the same length $L_1$ and width $W_1$ of the corresponding trench 211 as shown in FIGS. 2A and 2B. Consequently, the passive region 205 comprises the plurality of isolation structures 217 and the plurality of dummy structures 213 filled in the rectangle area not occupied by the isolation structures 217. A root mean square of the length $L_1$ and the width $W_1$ of each isolation structure 217 is less than about 5 μm. In one embodiment, for every two isolation structures 217, a dummy structure 213 is sandwiched between the two isolation structures 217 in the passive region 205. In another embodiment, the passive region 205 comprises only one isolation structure 217 and no dummy structure 213. The only one isolation structure 217 fills all the rectangle area of the passive region 205. In one example, a portion of the plurality of isolation structures 217 has different sizes in the passive region 205. Other portion of the plurality of isolation structures 217 has the same size in the passive region 205. In another example, all of the isolation structures 217 have different sizes in the passive region 205. In yet another example, all of the isolation structures 217 have the same size in the passive region 205.

Referring to FIG. 3, the structure 200 further comprises doped well regions 219 formed in the active region 203. In various examples, the doped well regions 219 include P-well regions and/or N-well regions having various doping configurations depending on design requirements as known in the art. The P-well region may be doped with n-type dopants, such as boron or $BF_2$. The N-well region may be doped with p-type dopants, such as phosphorus or arsenic. The P-well region and the N-well region can be configured respectively to provide channel regions for an N-type transistor and a P-type transistor in the following exemplary process.

Referring back to FIG. 1, method 100 continues with operation 110 in which a plurality of silicon gate stacks in the active region and at least one silicon resistor stack on the plurality of isolation structures are formed. In one embodiment, the plurality of silicon gate stacks and the at least one silicon resistor stack are formed simultaneously.

Figure 4A:
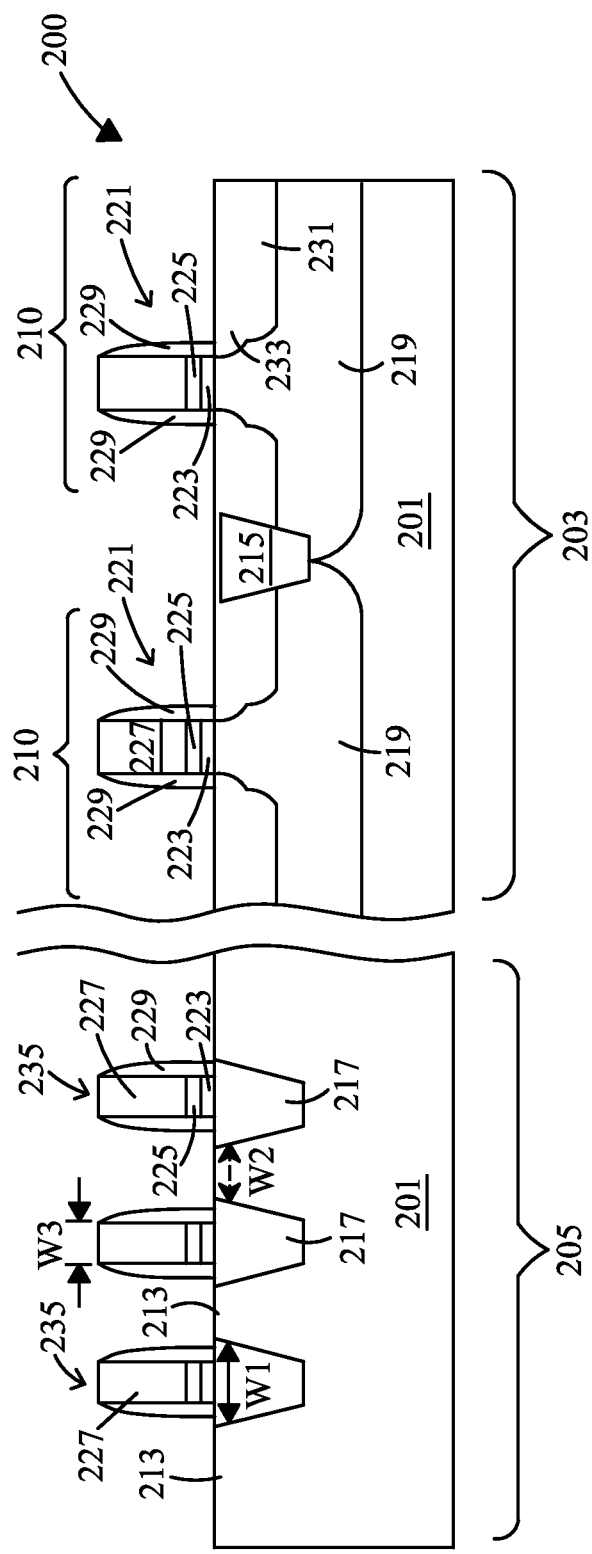

FIG. 4A illustrates the stage of operation 110 in a cross-sectional view of the structure 200. A plurality of silicon gate stacks 221 are formed in the active region 203 and at least one silicon resistor stack 235 are formed on the plurality of isolation structures 217 in the passive region 205. In one embodiment, the plurality of silicon gate stacks 221 and the at least one silicon resistor stack 235 are formed at the same time. In another embodiment, the plurality of silicon gate stacks 221 and the at least one silicon resistor stack 235 are formed in the same procedure, but not formed simultaneously. In some examples, the silicon gate stacks 221 and the silicon resistor stacks 235 may be formed by sequentially depositing and patterning a high-k dielectric layer 223, a conductive layer 225, and a silicon layer 227. The high-k dielectric layer 223 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO) or other suitable high-k dielectric materials. In various examples, the high-k dielectric layer 223 may be formed by atomic layer deposition (ALD), chemical vapor deposition (CVD), physical vapor deposition (PVD), and/or combinations thereof. The conductive layer 225 is capable of protecting the high-k dielectric layer 223 from being damaged during the operation for removing the silicon layer 227 in gate replacement process. The conductive layer 225 may include materials such as TiN, TaN, or any suitable materials. The silicon layer 227 may comprise polysilicon, amorphous silicon or single crystalline silicon. The silicon layer 227 may be formed by CVD, LPCVD, or other suitable processes. The silicon layer 227 may be doped to have a proper resistance or conductivity.

In one example, the materials for the high-k dielectric layer 223, the conductive layer 225, and the silicon layer 227 are blanket deposited over the entire substrate surface. Then, a photoresist layer (not shown) is formed over the silicon layer 227 by a suitable process, such as spin-on coating, and patterned to form a patterned photoresist feature by a proper lithography patterning method. The patterned photoresist feature can then be transferred using a dry etching process to the underlying layers (i.e. the high-k dielectric layer 223, the conductive layer 225, and the silicon layer 227) to form the silicon gate stacks 221 and the silicon resistor stacks 235.

Referring to FIG. 4A, lightly doped source/drain (LDD) regions 233 may be formed in the doped well regions 219 by implantation processes. The doping species may depend on the type of device being fabricated, such as an NMOS or PMOS device. After the LDD formation process, a layer of spacer material is formed to cover the silicon gate stacks 221 and the silicon resistor stacks 235. A plasma etching process is performed to pattern the spacer layer material to define spacers 229 on sidewalls of silicon gate stacks 221 and the silicon resistor stacks 235. The spacer layer material, also the spacers 229, comprises silicon nitride, silicon oxynitride, and/or combination thereof. Following the spacer formation process, source/drain regions 231 are formed in the doped well regions 219. The source/drain regions 231 may be formed by one or more ion implantation processes. The implanted species may depend on the type of device being fabricated, such as an NMOS or PMOS device. The source/drain regions 231 may comprise various doping profiles, and the source/drain regions 231 may be aligned with outer edges of spacers 229.

FIG. 4B is a top view of the passive region 205 illustrated in FIG. 4A. The passive region 205 in FIG. 4A is the cross-sectional view obtained from the vertical plane crossing line A-A' in FIG. 4B. In FIG. 4B, the dummy structures 213, the isolation structures 217 and the silicon resistor stacks 235 are shown. The spacers 229 are not shown in this FIG. 4B. In the passive region 205, each silicon resistor stack 235 is defined by a length $L_3$ and a width $W_3$. In one embodiment, the length $L_3$ is in a range of about 0.4 μm to about 9.2 μm. The width $W_3$ is in a range of about 0.4 μm to about 9.2 μm. A ratio of the width $W_3$ of each silicon resistor stack 235 to the width $W_1$ of each isolation structure 217 is in a range of about 33% to about 92%. When the ratio is lower than 33%, the mismatch performance of each silicon resistor stack 235 could rise. It is hard to accurately control electrical performance of each silicon resistor stack within the chip region. When the ratio is higher than 92%, the underlying isolation structure 217 could not provide good isolation for individual active/passive devices.

In one example, at least one silicon resistor stack 235 is formed on each of the plurality of isolation structures 217. In another example, more than one silicon resistor stack 235 is formed on one of the plurality of isolation structures 217. In yet another example, a portion of the plurality of isolation structures 217 has at least one silicon resistor stack 235 formed on each isolation structure 217. Other portion of the plurality of isolation structures 217 has no silicon resistor stack 235 formed on the isolation structures 217.

Referring back to FIG. 1, method 100 continues with operation 112 in which a dielectric layer is deposited on the substrate over the plurality of silicon gate stacks and the at least one silicon resistor stack.

Figure 5:
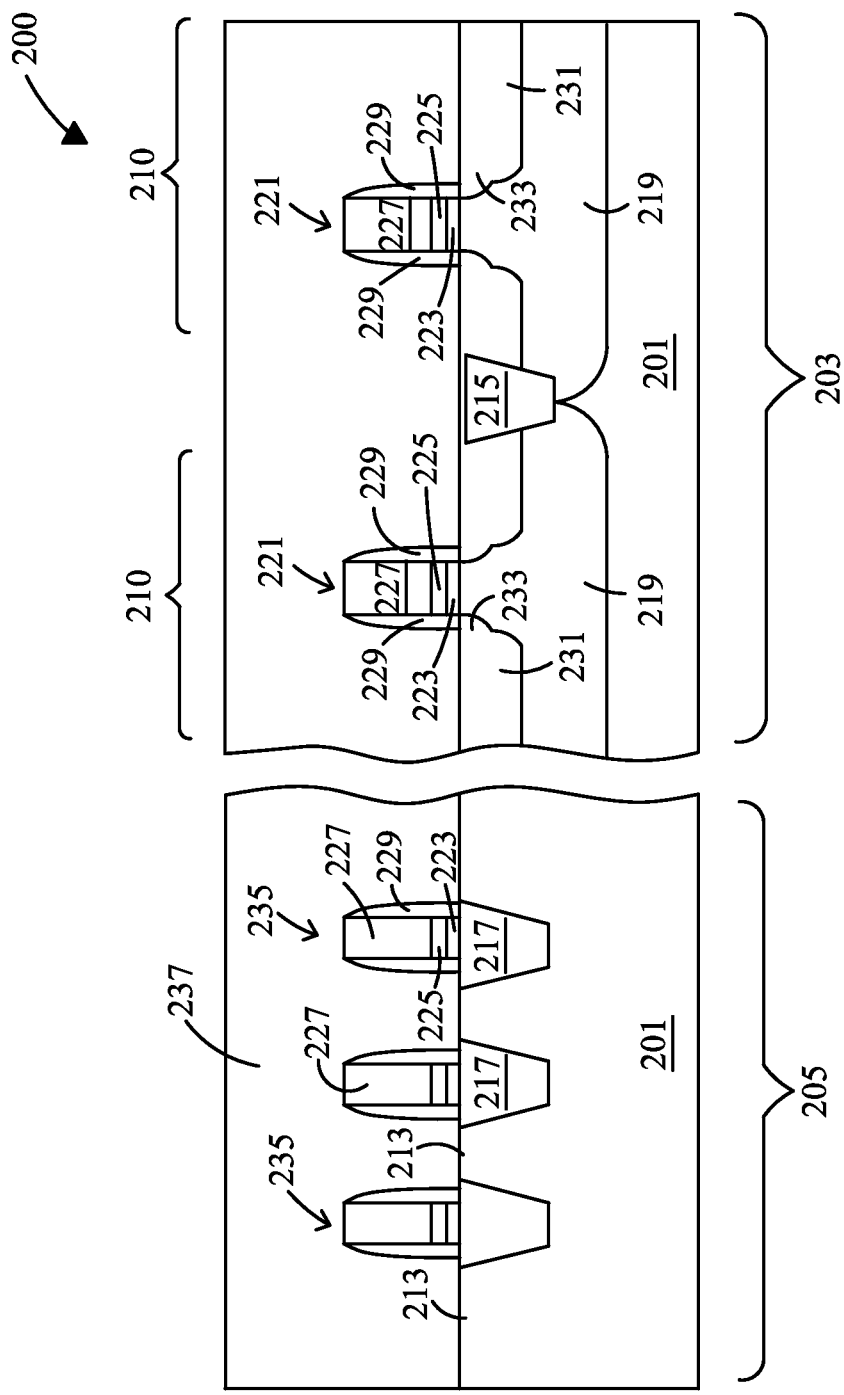

FIG. 5 depicts a cross-sectional view of the structure 200 after performance of operation 112. The structure 200 illustrates that a dielectric layer 237 (e.g. inter-level dielectric layer) is deposited over the substrate 201, and over the silicon gate stacks 221 and the silicon resistor stacks 235. The dielectric layer 237 may comprise silicon oxide, spin-on glass (SOG), fluorinated silica glass (FSG), carbon doped silicon oxide (e.g. SiCOH), BLACK DIAMOND® (Applied Materials, Santa Clara, Calif., USA), or other suitable dielectric materials. The dielectric layer 237 may be formed by CVD, LPCVD, high density plasma deposition (HDP) or spinning on glass. The dielectric layer 237 is formed on the substrate 201 to a level above the top surface of the silicon gate stacks 221 and the silicon resistor stacks 235 such that the plurality of silicon gate stacks 221 and the silicon resistor stacks 235 are embedded in.

Referring back to FIG. 1, method 100 continues with operation 114 in which the dielectric layer deposited over the substrate is planarized. The plurality of silicon gate stacks and the at least one silicon resistor stack are exposed.

Figure 6:
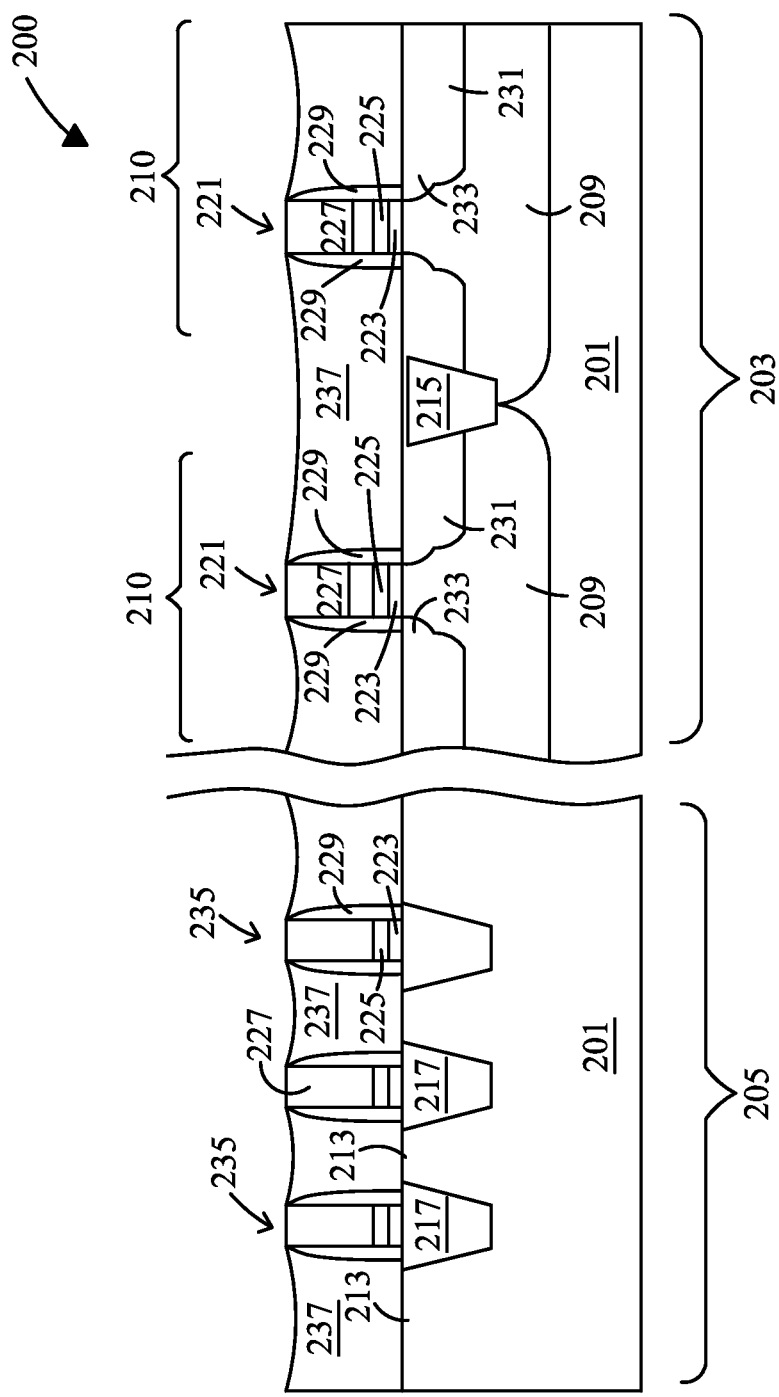

FIG. 6 depicts the structure 200 shown in FIG. 5 after operation 114 is performed. A planarization process is performed to remove the dielectric layer 237 above the top surface of the plurality of silicon gate stacks 221 and the silicon resistor stacks 235. The planarization process may comprise a chemical mechanical polishing (CMP), an etch, or a combination thereof. The top surface of the plurality of silicon gate stacks 221 and the silicon resistor stacks 235 are exposed after the planarization process.

Referring back to FIG. 1, method 100 continues with operation 116 in which portions of the plurality of silicon gate stacks are removed thereby a plurality of openings surrounded by the dielectric layer are left. In one embodiment, portions of the at least one silicon resistor stack on the plurality of isolation structures are also removed in this operation. A plurality of holes are formed by the removed portion of the at least one silicon resistor stack.

Figure 7A:
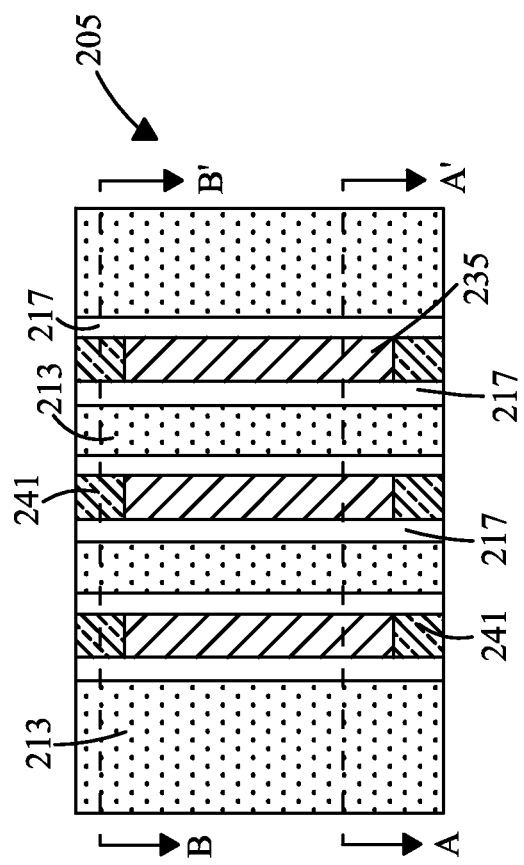

FIG. 7A is a top view of the passive region 205 after performance of operation 116. In FIG. 7A, the dummy structures 213, the isolation structures 217 and the silicon resistor stacks 235 are shown. A plurality of holes 241 are also shown. The holes 241 are formed by the removed portions of the at least one silicon resistor stack 235 on the plurality of isolation structures 217. In one example, portions of the silicon layer 227 in the at least one silicon resistor stack 235 are removed. The underlying conductive layer 225 is exposed through the holes 241. The spacers 229 and the dielectric layer 237 are not shown in this FIG. 4A.

Figure 7B:
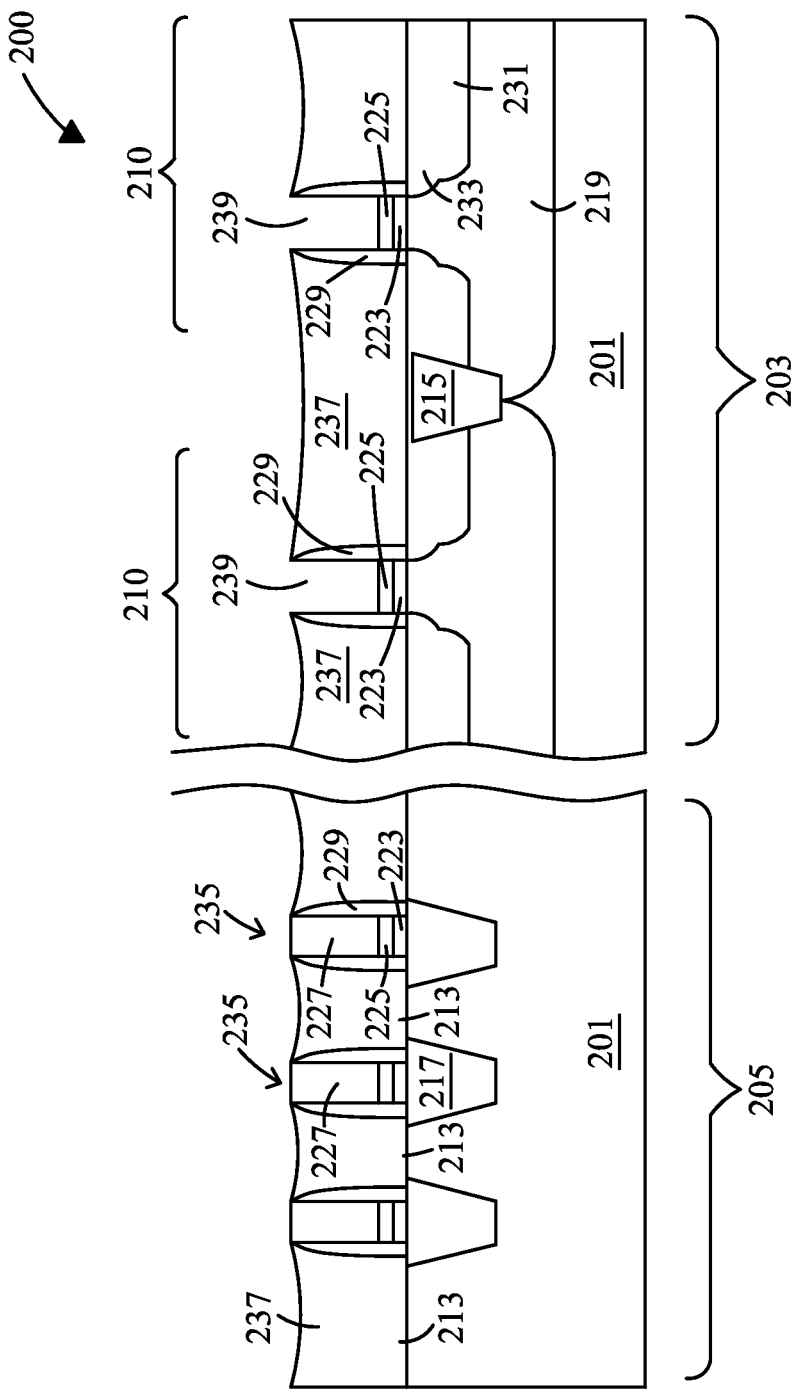
Figure 7C:
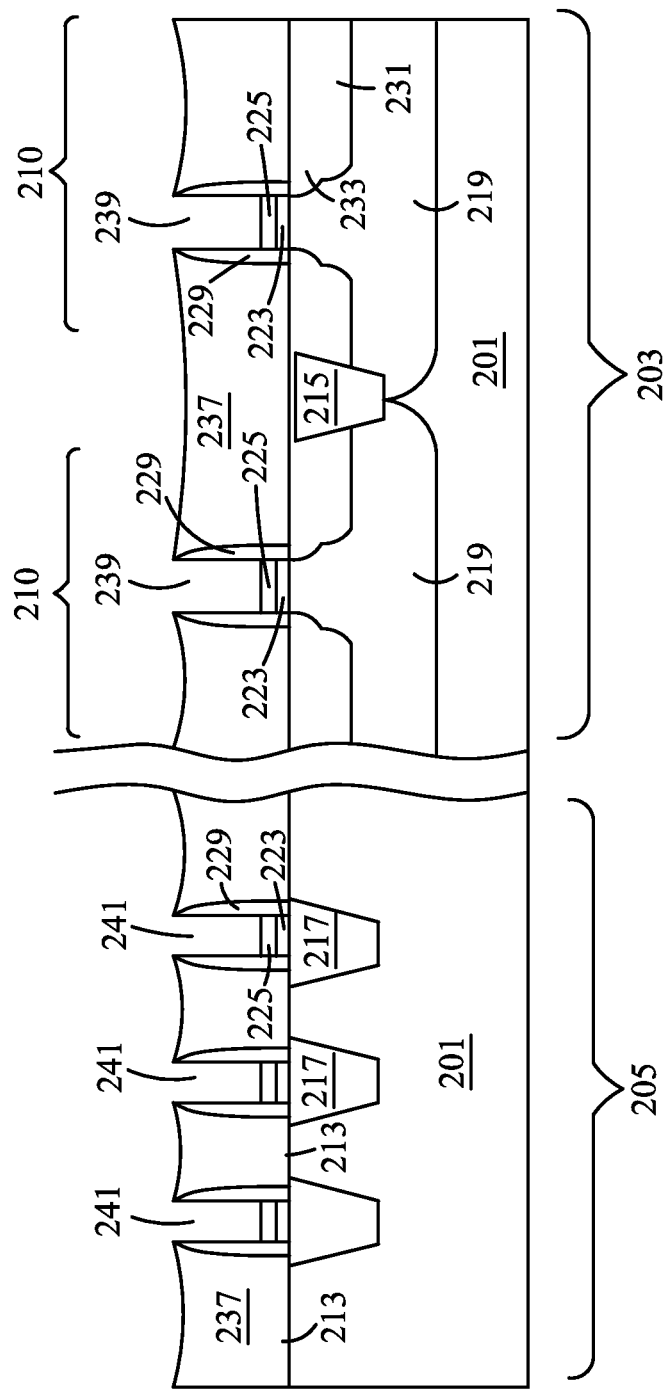

FIG. 7B is a cross-sectional view of the structure 200 after the performance of operation 116. FIG. 7B is a cross-sectional view of the passive region 205 obtained from the vertical plane crossing line A-A' in FIG. 7A. In one embodiment, the silicon layer 227 of the silicon gate stacks 221 are removed thereby a plurality of openings 239 surrounded by the dielectric layer 237 are left. FIG. 7C is a cross-sectional view of the passive region 205 obtained from the vertical plane crossing line B-B' in FIG. 7A. In another embodiment as shown in FIG. 7C, portions of the silicon layer 227 in the at least one silicon resistor stack 235 are also selectively removed during the removal of the silicon gate stacks 221. The holes 241 are formed in the silicon resistor stacks 235. In one example, a patterned mask layer (not shown) is formed over the structure 200 to cover the un-removed areas (e.g. the passive region 205 except the holes 241 in FIG. 7A) of the structure 200 and expose portions of the structure 200 to remove the silicon layer 227 of the silicon gate stacks 221 and the silicon resistor stacks 235. Then, the openings 239 (shown in FIGS. 7B and 7C) in the active region 203 and the holes 241 (shown in FIG. 7C) in the passive region 205 are formed during an etching process. The un-removed areas underlying the patterned mask layer are substantially protected from being removed during the etching process. The etching process used to remove the silicon layer 227 may be implemented by performing suitable dry etching, wet etching or combinations thereof. In one example, an etching solution including $HNO_3$, $H_2O$ and HF may be used to remove silicon layer 227. In another example, chlorine (Cl)-based plasma may be used to selectively remove the silicon layer 227 without removing the underlying conductive layer 225.

FIG. 7C is a cross-sectional view of the passive region 205 obtained from the vertical plane crossing line B-B' in FIG. 7A. As presented in the previous discussion, the holes 241 are not covered by the patterned mask layer during the etching process. Portions of the silicon layer 227 on the silicon resistor stack 235 are removed to form the holes 241.

Referring back to FIG. 1, method 100 continues with operation 118 in which a material of high K metal gate is deposited over the substrate to fill the plurality of openings. In one embodiment, the removed portions of the at least one silicon resistor stack are also filled with the material of high K metal gate in this operation.

Figure 8A:
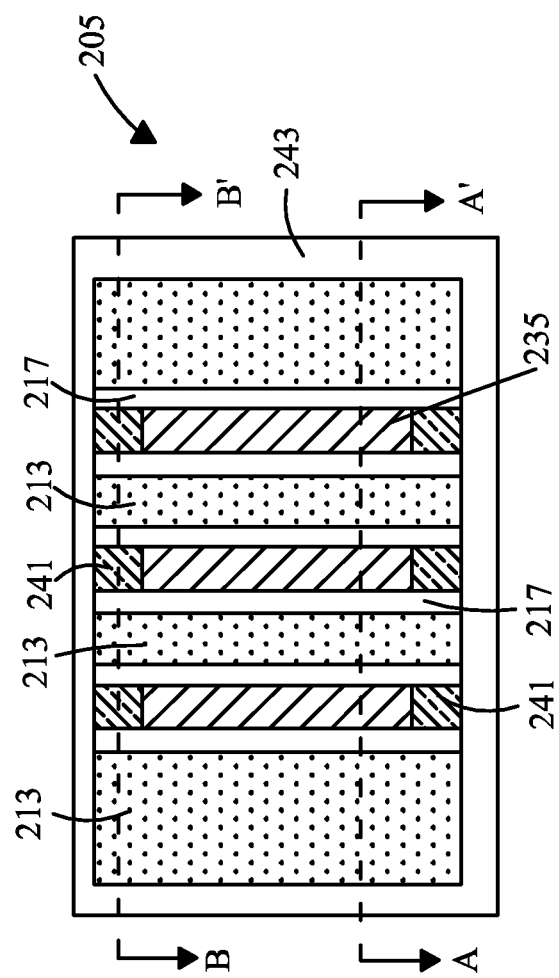

FIG. 8A illustrates a top plan view of the passive region 205 at the stage of operation 118. In FIG. 8A, the dummy structures 213, the isolation structures 217 and the silicon resistor stacks 235 are shown. Also, a material of high K metal gate 243 is formed over the substrate. The holes 241 shown in FIG. 7A are also filled with the material of high K metal gate 243. The spacers 229 and the dielectric layer 237 are not shown in this FIG. 8A.

Figure 8B:
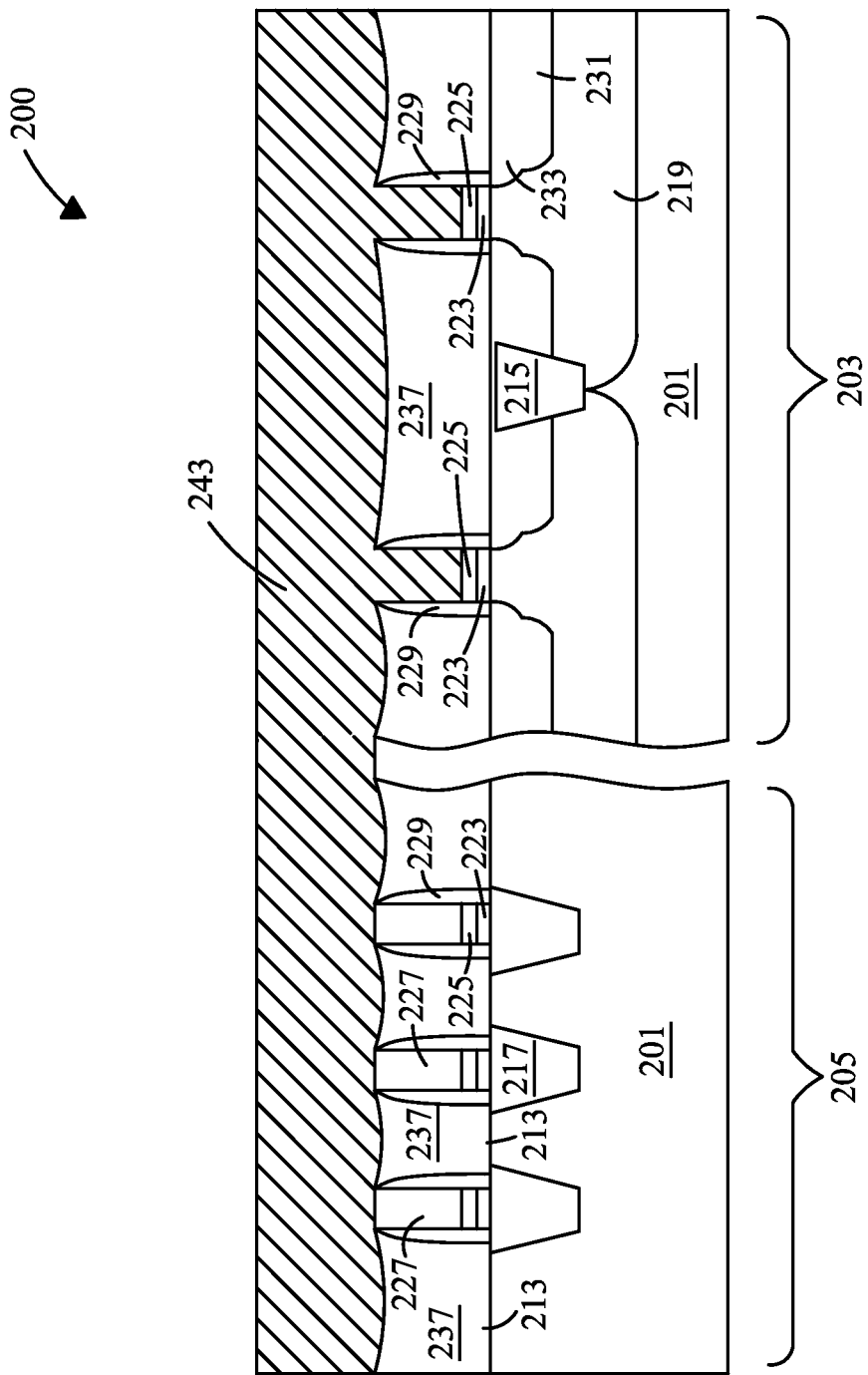
Figure 8C:
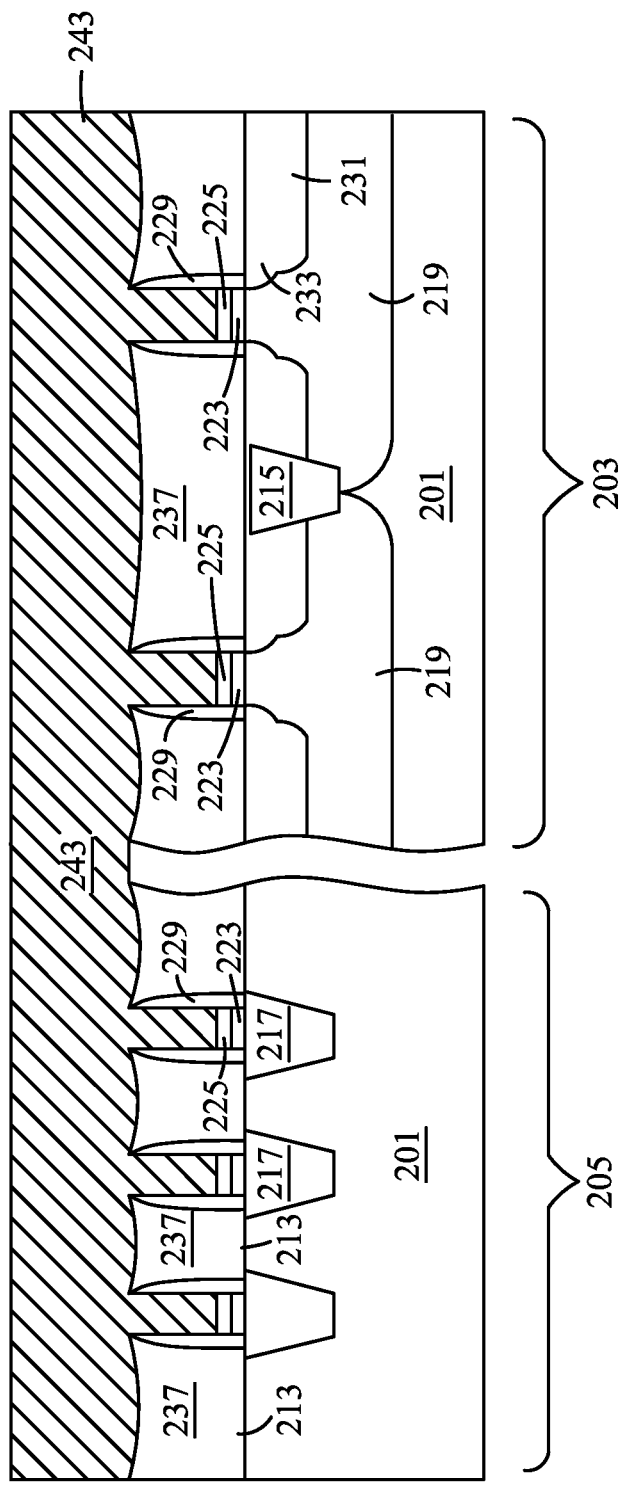

FIG. 8B is a cross-sectional view of the structure 200 after the performance of operation 118. FIG. 8B is a cross-sectional view obtained from the vertical plane crossing line A-A' in FIG. 8A. In FIG. 8B, a material of high K metal gate 243 is deposited over a level above the surface of the planarized dielectric layer 237 of the structure 200. The material of high K metal gate 243 fills in the openings 239 in the active region 203 and the holes 241 in the passive region 205. In the present embodiment, the material of high K metal gate 243 includes a p-metal layer and a conductive material layer. The p-metal includes a metal-based material having a work function compatible to form P-type transistor. For one example, the p-metal has a work function of about or greater than about 5.2 eV. In some embodiments, the p-metal includes titanium nitride (TiN), tantalum nitride (TaN), tungsten nitride (WN), titanium aluminum (TiAl), or combinations thereof. The p-metal may include various metal-based film as a stack for optimized device performance and processing compatibility. The p-metal layer can be formed by a suitable process, such as PVD. The conductive material thereafter substantially fills in the openings 239 and the holes 241. The conductive material includes tungsten or aluminum according to various embodiments. The method to form the conductive material may include CVD or PVD.

In other embodiments, the material of high K metal gate 243 includes an n-metal layer and a conductive material layer. The n-metal has a work function of about or less than about 4.2 eV. The application of p-metal and n-metal may depend on the type of device being fabricated, such as an NMOS or PMOS device. This disclosure is not limited to the above conditions for forming the material of high K metal gate 243, and different conditions that produce compatible to form an NMOS or PMOS device are within the scope of this disclosure.

Referring back to FIG. 1, method 100 continues with operation 120 in which the material of high K metal gate deposited over the substrate is planarized. A corresponding plurality of high K metal gate stacks and the at least one silicon resistor stack on the plurality of isolation structures are exposed.

Figure 9:
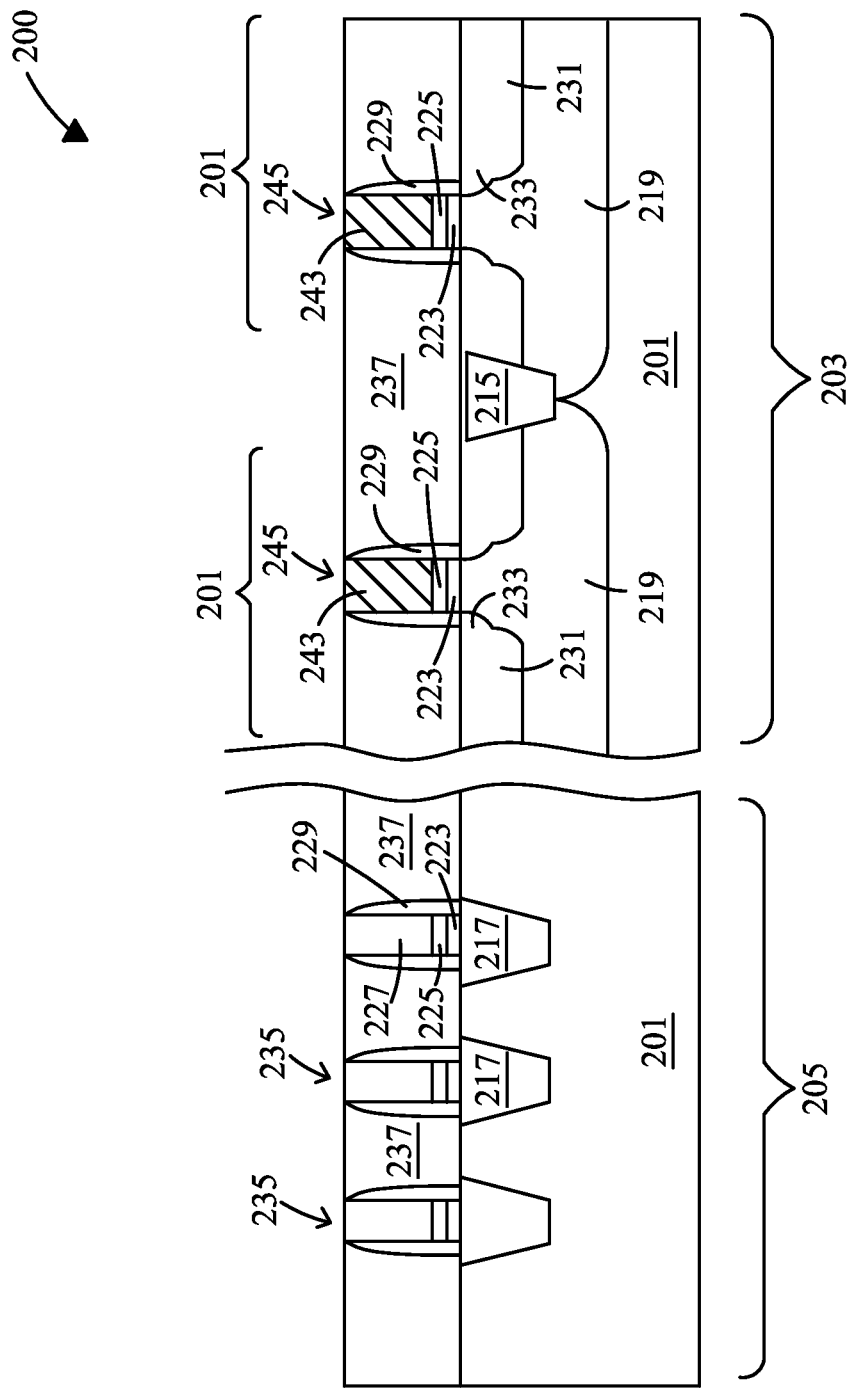

FIG. 9 depicts the structure 200 in FIG. 8B after the performance of planarizing operation 120. A planarization process is performed to remove the material of high K metal gate 243 above the top surface of the planarized dielectric layer 237 and the silicon resistor stacks 235. The planarization process may comprise chemical mechanical polishing (CMP), an etch, or a combination of these. Corresponding high K metal gate stacks 245 are formed to replace the silicon gate stacks 221. Also, various electrode features with the material of high K metal gate 243 are formed in the holes 241 to contact the remained portions of the silicon resistor stack 235. The silicon resistor stack 235 and the electrode features embedded therein constitute the passive device that can be used as a resistor or a fuse. The electrode features provide electrical connection for the passive device formed passive region 205 to other components.

Various embodiments of the present disclosure may be used to improve previous manufacturing processes for an integrated circuit having a silicon resistor. For example, this disclosure provides use of the dummy structures improves the uniformity of the polished surface of isolation structures formed in the trenches in the later planarization process. The polished surface of isolation structures and the substrate get a smooth surface. The uniformly new surface would enhance capability of the following lithography process on the new surface. The leakage current, device performance and yield on the completed products are thus significantly increased. This disclosure is not limited to the above conditions for gate replacement processes. The gate-first process as shown in operation 102 to 110 that produce beneficial effects to improve the uniformity of the polished surface of isolation structures are within the scope of this disclosure.

An embodiment of the disclosure describes an integrated circuit. The integrated circuit includes a substrate having an active region and a passive region. The active region is adjacent to the passive region. At least one isolation structure is disposed in the substrate in the passive region. A root mean square of a length and a width of each isolation structure is less than 5 μm. At least one silicon resistor stack is disposed on the at least one isolation structure.

The present disclosure also describes an embodiment of a method of forming an integrated circuit having a silicon resistor. The method includes providing a substrate having an active region and a passive region. The active region is adjacent to the passive region. A plurality of trenches are formed in the substrate in the passive region, thereby a portion of the substrate is sandwiched between every two trenches. A root mean square of a length and a width of each trench is less than about 5 μm. An isolation material is deposed over the substrate to fill the plurality of trenches. The isolation material is planarized to from a plurality of isolation structures in the trenches in the substrate. A plurality of silicon gate stacks in the active region on the substrate and at least one silicon resistor stack on the plurality of isolation structures are formed. A dielectric layer is formed over the substrate to surround the plurality of silicon gate stacks and the at least one silicon resistor stack. The plurality of silicon gate stacks are replaced with a corresponding plurality of high-K metal gates.

The present disclosure also describes another embodiment of a method of forming an integrated circuit having a silicon resistor. The method includes providing a substrate having an active region and a passive region. The active region is adjacent to the passive region. A plurality of trenches having the same size are formed in the substrate in the passive region. A root mean square of a length and a width of each trench is less than about 5 μm. An isolation material is deposed over the substrate to fill the plurality of trenches. The isolation material is planarized to from a plurality of isolation structures in the substrate. A plurality of silicon gate stacks in the active region and at least one silicon resistor stack on each of the plurality of isolation structures are formed simultaneously.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. An integrated circuit, comprising:
    a substrate having an active region and a passive region, the active region adjacent to the passive region;
    at least one isolation structure disposed in the substrate in the passive region, wherein a root mean square of a length and a width of each of the at least one isolation structure is less than 5 μm, and the length and the width of each of the at least one isolation structure are determined in a plan view of the substrate; and
    at least one silicon resistor stack disposed on the at least one isolation structure.

2. The integrated circuit of claim 1, wherein
    the at least one isolation structure comprises a plurality of isolation structures, and
    every two of the plurality of isolation structures sandwich a portion of the substrate between the two isolation structures.

3. The integrated circuit of claim 2, wherein the at least one silicon resistor stack is on one of the two isolation structures.

4. The integrated circuit of claim 2, wherein the two isolation structures have different sizes.

5. The integrated circuit of claim 2, wherein more than one silicon resistor stack is located on one of the two isolation structures.

6. A method of forming an integrated circuit, the method comprising:
    forming a plurality of trenches in a passive region of a substrate, a portion of the substrate sandwiched between every two trenches of the plurality of trenches, each of the plurality of trenches having a depth in a thickness direction of the substrate, each of the plurality of trenches further having a width and a length in directions transverse to the thickness direction, wherein a root mean square of the length and the width of each of the plurality of trenches is less than about 5 μm, and the substrate further comprises an active region adjacent to the passive region;
    depositing an isolation material over the substrate to fill the plurality of trenches;
    planarizing the isolation material to from a plurality of isolation structures in the plurality of trenches in the substrate; and
    forming a plurality of silicon gate stacks in the active region on the substrate and at least one silicon resistor stack on the plurality of isolation structures;
    forming a dielectric layer over the substrate to surround the plurality of silicon gate stacks and the at least one silicon resistor stack; and
    replacing the plurality of silicon gate stacks with a corresponding plurality of high K metal gates.

7. The method of claim 6, wherein at least one silicon resistor stack is formed on each of the plurality of isolation structures.

8. The method of claim 6, wherein more than one silicon resistor stack is formed on one of the plurality of isolation structures.

9. The method of claim 6, wherein some of the plurality of isolation structures have different sizes.

10. The method of claim 6, wherein a ratio of a width of the portion of the substrate between every two trenches of the plurality of trenches to a width of each of the plurality of trenches is larger than or equal to 6%.

11. The method of claim 6, wherein said replacing the plurality of silicon gate stacks comprises:
    removing the plurality of silicon gate stacks to leave a plurality of openings surrounded by the dielectric layer;
    depositing a material of high K metal gate over the substrate to fill the plurality of openings; and
    planarizing the material of high K metal gate to expose the corresponding plurality of high K metal gate stacks and the at least one silicon resistor stack.

12. The method of claim 11, further comprising:
    removing portions of the at least one silicon resistor stack during said removing the plurality of silicon gate stacks; and
    filling the removed portions of the at least one silicon resistor stack with the material of high K metal gate during said depositing the material of high K metal gate.

13. A method of forming an integrated circuit, the method comprising:
    providing a substrate having an active region and a passive region, the active region being adjacent to the passive region;
    forming a plurality of trenches having the same size in the substrate in the passive region, each of the plurality of trenches having a depth in a thickness direction of the substrate, each of the plurality of trenches further having a width and a length in directions transverse to the thickness direction, wherein a root mean square of the length and the width of each of the plurality of trenches is less than about 5 μm;
    depositing an isolation material over the substrate;
    planarizing the isolation material to form a plurality of isolation structures in the substrate; and
    forming a plurality of silicon gate stacks in the active region on the substrate and at least one silicon resistor stack on each of the plurality of isolation structures simultaneously.

14. The method of claim 13, further comprising:
    forming a dielectric layer on the substrate over the plurality of silicon gate stacks and the at least one silicon resistor stack on each of the plurality of isolation structures;
    planarizing the dielectric layer, thereby exposing the plurality of silicon gate stacks and the at least one silicon resistor stack on each of the plurality of isolation structures; and
    replacing the plurality of silicon gate stacks with a corresponding plurality of high K metal gate stacks.

15. The method of claim 14, wherein said replacing the plurality of silicon gate stacks comprises:
    removing the plurality of silicon gate stacks to leave a plurality of openings surrounded by the dielectric layer;

depositing a material of high K metal gate over the substrate to fill the plurality of openings; and planarizing the material of high K metal gate to expose the corresponding plurality of high K metal gate stacks and the at least one silicon resistor stack on each of the plurality of isolation structures.

16. The method of claim 15, further comprising:

removing portions of the at least one silicon resistor stack on each of the plurality of isolation structures during said removing the plurality of silicon gate stacks; and filling the removed portions of the at least one silicon resistor stack on each of the plurality of isolation structures with the material of high K metal gate during said depositing the material of high K metal gate.

17. The method of claim 13, further comprising:

leaving a portion of the substrate having a width between every two trenches of the plurality of trenches, the width being within a range of about 0.07 μm to about 10 μm.

18. The method of claim 13, wherein a ratio of a width of a portion of the substrate between every two trenches of the plurality of trenches to the width of the trench is larger than or equal to 6%.

19. The method of claim 13, wherein a ratio of a width of the silicon resistor stack to the width of the corresponding trench is about 33% to 92%.

20. The method of claim 13, wherein the length of each of the plurality of trenches is a range of about 1.2 μm to about 10 μm, and the width of each of the plurality of trenches is a range of about 1.2 μm to about 10 μm.

* * * * *